(12) United States Patent
French et al.

(10) Patent No.: US 6,773,941 B2
(45) Date of Patent: Aug. 10, 2004

(54) PIXELLATED DEVICES SUCH AS ACTIVE MATRIX LIQUID CRYSTAL DISPLAYS AND METHODS OF MANUFACTURING SUCH

(75) Inventors: Ian D. French, Hove (GB); Pieter J. Van der Zaag, Pyrford (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 221 days.

(21) Appl. No.: 10/055,377

(22) Filed: Jan. 22, 2002

(65) Prior Publication Data
US 2002/0102855 A1 Aug. 1, 2002

(30) Foreign Application Priority Data
Jan. 27, 2001 (GB) .............................................. 0102167

(51) Int. Cl.[7] .............................................. H01L 21/00
(52) U.S. Cl. .............................. 438/29; 438/30; 438/66
(58) Field of Search .............................. 438/22–38, 66, 438/149

(56) References Cited
U.S. PATENT DOCUMENTS

| | | | | |
|---|---|---|---|---|
| 5,790,215 A | * | 8/1998 | Sugahara et al. | 349/74 |
| 5,920,084 A | * | 7/1999 | Gu et al. | 257/59 |
| 6,100,950 A | * | 8/2000 | Tanaka | 349/47 |
| 6,359,672 B2 | * | 3/2002 | Gu et al. | 349/138 |
| 6,498,087 B2 | * | 12/2002 | French et al. | 438/609 |
| 2003/0148560 A9 | * | 8/2003 | Deane et al. | 438/151 |

FOREIGN PATENT DOCUMENTS
WO  WO9959024  11/1999  ......... G02F/1/1343

OTHER PUBLICATIONS
"Conductivity Enhancement of Transparent Electrode by Side–Wall Copper Electroplating", J Liu et al, SID 93 Digest, pp. 554–557,.
"A TFT manufactured by 4 masks process with new photolithography", C.W. Han et al, SID Proceedings of the 18th International Display Research Conference, pp. 1109–1112.
"A Novel Four Mask–Count Process Architecture for TFT–LCDs", C.W. Kim et al, SID 00 Digest, pp. 1006–1009.

* cited by examiner

Primary Examiner—Duy-Vu Deo

(57) ABSTRACT

A method for use in the fabrication of active plates for pixilated devices, such as active matrix liquid crystal displays, having pixel electrodes (38) and associated address lines (32) formed from a layer of transparent conductive material (53) through which the conductivity of the address lines is improved. The transparent conductive layer (53) and a metal layer (54) are deposited in succession and followed by a shielding layer (60), e.g. of photoresist, which is patterned into a configuration of regions (67,68,69) corresponding to the required pixel dielectrodes and address lines with a property of the layer at these respective regions being different. This enables the regions of this layer corresponding to the pixel electrodes to be selectively etched away, thereby allowing the metal at these regions to be selectively removed while leaving metal at the address lines. The method simplifies the production of low mask mount TFT active plates with improved address line conductivity.

10 Claims, 7 Drawing Sheets

PIXELLATED DEVICES SUCH AS ACTIVE MATRIX LIQUID CRYSTAL DISPLAYS AND METHODS OF MANUFACTURING SUCH

This invention relates to pixellated devices such as active matrix liquid crystal displays, and particularly to methods of fabricating the substrate with the active matrix circuit, known as the active plate, used in the manufacture of such devices.

An active matrix liquid crystal display (AMLCD) typically comprises an active plate and a passive plate between which liquid crystal material is sandwiched. The active plate comprises an array of transistor switching devices, typically with one transistor associated with each pixel of the display. Each pixel also has a pixel electrode on the active plate to which a signal is applied for controlling the display output of the individual pixel.

FIG. 1 shows the electrical components which make up the pixels of one known example of active plate of an AMLCD. The pixels are arranged in rows and columns. The row conductor 10 of a pixel is connected to the gate of the TFT (thin film transistor) 12, and the column electrode 14 is coupled to the source. The liquid crystal material provided over a pixel electrode of the pixel effectively defines a liquid crystal cell 16 which is connected between the drain of the transistor 12 and a common ground plane 18. An optional pixel storage capacitor 20 is connected between the drain of the transistor 12 and the row conductor 10 associated with an adjacent row of pixels.

For transmissive displays, a large area of the active plate is at least partially transparent, and this is required because this type of display is illuminated by a back light. In these display devices, the pixel electrode must be transparent, whereas row and column conductors are usually formed as metallic lines which are opaque. Metallic layers, such as chromium, aluminium, alloys or multilayer structures are used for the row and column conductors because of the high conductivity, which improves the device performance. The conductivity of the lines (usually the column lines) to which the pixel drive signals are applied is particularly important in large displays, because a sizeable voltage drop occurs over the length of the line, making it impossible to drive uniformly all pixels along the line (column).

A problem with the use of metallic column conductors is that separate deposition and lithographic procedures are required to form the column conductors and the pixel electrodes. The pixel electrodes must be transparent, and are typically formed from a transparent conductive oxide film. It is well known that the lithography steps in the manufacturing process are a major contributing factor to the expense of the manufacturing process. Each lithographic step can be considered to reduce the yield of the process, as well as increasing the cost.

The conventional manufacturing process for the active plate of an LCD is a five mask process. With reference to the bottom gate TFT LCD active plate shown in FIG. 2, the process steps, each requiring a separate mask definition, are:

(i) defining the gate 22 (which is part of the row conductor) over the substrate 21;

(ii) defining the amorphous silicon island (which overlies a gate dielectric 23 that covers the entire structure), comprising a lower intrinsic layer 24 and an upper doped contact layer 26;

(iii) defining the metallic source 28, drain 30 and column electrode 32;

(iv) defining a contact hole 34 in a passivation layer 36 which covers the entire substrate; and (v) defining the transparent pixel electrode 38 which contacts the drain 10 through the hole 34.

The capacitor shown in FIG. 1 may simply be formed from the gate dielectric by providing an area of overlap of one pixel electrode with a portion of the row/gate conductor of the adjacent row.

There have been various proposals to reduce the number of lithography steps, and thereby the mask count, of the manufacture process in order to reduce cost and increase yield.

For example, it has been proposed to form the column conductors from the same transparent conductive oxide film as the pixel electrode, so that these components of the pixel structure can be deposited and patterned together. Additional measures can result in a two mask process, and this is explained with reference to the bottom gate TFT LCD active plate shown in FIG. 3. The process steps, each requiring a separate mask definition, are:

(i) defining the gate 22 (and row conductors); and (ii) defining the transparent column electrode 32 (which also forms the TFT source 28) and the pixel electrode 38 (which also forms the TFT drain 30).

The definition of the semiconductor island 24, 26 can be achieved by a self-aligned process using the gate 22, for example by using light exposure through the substrate. Of course, the semiconductor could equally be formed with a third mask step (between steps (i) and (ii) above). In the periphery of the array, the gate dielectric 23 is etched away using a low-precision stage, to allow contact to the gate lines at the periphery of the display.

In this structure, the high resistivity of the transparent conductive oxide film used for the column lines prevents the use of the structure in large (TV-sized) displays.

For this reason, there are further proposals to treat the column conductor area of the layer to increase the conductivity, whilst not affecting the transparency of the pixel electrode. For example, the article "Conductivity Enhancement of Transparent Electrode by Side-Wall Copper Electroplating", J. Liu et al, SID 93 Digest, page 554 discloses a method of enhancing the conductivity by electroplating a copper bus to the sidewall of the metal oxide column line. The process involves an incomplete etching process to leave metal oxide residues, which act as seeds for the copper growth. The process is complicated and difficult to control. In addition, the copper bus will surround the source and drain electrodes, and there is a risk of shorts between the source and drain resulting from fast lateral copper growth when forming the bus. The copper bus around the source and drain electrodes also influences the channel length of the TFT and therefore makes the TFT characteristics less predictable.

WO 99/59024 discloses a method for enhancing the conductivity of a transparent electrode by providing patterned metallic layers adjacent to the transparent electrodes.

There is still a need for a simple process for increasing the conductivity of a transparent metal oxide layer, such as ITO, without increasing dramatically the complexity of the process. Such a process will find for example application in active matrix LCD manufacture but will also be useful for other technologies where mask count reduction could be achieved if a transparent conductive layer could be made more conductive in certain areas without losing the transparency in others. This may be of benefit in, for example, polymer LED displays and large area image sensors.

According to a first aspect of the invention, there is provided a method of fabricating an active plate comprising pixel electrodes and associated address lines formed from a transparent conductive material, which method comprises:

providing a transparent conductive material layer and a metal layer in succession over a substrate, depositing and patterning a shielding layer into a configuration corresponding to the desired pattern of the transparent conductive layer required for the pixel electrodes and the address lines, the shielding layer being formed in a manner such that an etching property of the shielding layer at regions corresponding to the pixel electrodes differs from that at the regions corresponding to the address lines, subjecting the shielding layer to an etching process using the difference in properties so as to remove the regions of the shielding layer corresponding to the pixel electrodes while leaving portions of the shielding layer at the regions corresponding to the address lines, and thereafter removing the portions of the metal layer at the regions corresponding to the pixel electrodes. The remaining portions of the shielding layer may subsequently be removed.

Through this method, an active plate is fabricated in which the pixel electrodes comprise transparent conductive material and the associated address lines comprise transparent conductive material, from the same deposited layer as the pixel electrodes, together with an overlying coating of metal. The address lines are thus of a composite nature, comprising a combination of the transparent conductive material with overlying metal, and consequently, the effective electrical conductivity of the address lines is considerably improved compared with those of the known method comprising transparent conductive material alone. At the same time, the complexity of the kind of plating method entailed in the approach proposed by Liu et al is avoided.

The invention provides a simple process that produces address lines with reduced resistivity while maintaining high transparency of the pixel electrodes. The process is compatible with an overall simple, low mask count, fabrication method suitable for making active plates for AMLCDs and the like and satisfies the required characteristics of line conductivity and pixel transparency for producing devices of large size and/or high resolution. Importantly, the invention also has the advantage of being compatible with existing manufacturing equipment.

The shielding layer preferably comprises photoresist.

In a preferred embodiment, the property of the shielding layer which differs for the pixel electrode and address line corresponding regions and which affects the etching characteristic comprises thickness of the layer, and in this case the thickness of the shielding layer is made greater at the regions corresponding to the address lines than at the regions corresponding to the pixel electrodes.

When using photoresist for the shielding layer, the patterning of the layer into selected regions of different thickness can conveniently be accomplished using a photolithographic patterning technique of the kind described by C. W. Han et al in the paper entitled "A TFT manufactured by 4 masks process with new photolithography" published in SID Proceedings of the 18th International Display Research Conference", (Asia Display '98), pages 1109–1112. This technique involves the use of a photomask which, in addition to light blocking and transparent areas, has regions with grid or slit patterns. These regions, through diffraction effects, control the extent of exposure of the photoresist and thus the thickness of the resulting photoresist, the thickness being less than that produced by light-blocking regions of the mask.

It is envisaged that other techniques could be employed to produce selected regions of different thickness in the shielding layer and also that the property of the shielding layer which differs, and which affects the etching characteristic of the layer such that certain areas can be selectively etched away while leaving shielding layer material at other areas, could be other than thickness.

According to a second aspect of the invention, there is provided a method of manufacturing an active plate for a liquid crystal display, comprising:

depositing and patterning a gate conductor layer over an insulating substrate;

depositing a gate insulator layer over the patterned gate conductor layer;

depositing a silicon layer over the gate insulator layer;

depositing a transparent conductor layer over the substrate;

depositing a metal layer over the transparent conductor layer;

depositing and patterning an etchable shielding layer over the metal layer, the shielding layer having a configuration defining source and drain areas, pixel electrode areas, and line conductor areas associated with the source or drain conductors, the regions of the shielding layer defining the line conductor areas having a thickness greater than that of the regions defining the pixel electrodes;

patterning the transparent conductor layer and the metal layer using the shielding layer;

partially etching the shielding layer to remove the thinner regions so as to expose the metal layer at the pixel electrode regions;

and removing the metal layer regions at the pixel electrode regions.

This method can enable a two mask process to be used to fabricate the active plate, and in which the conductivity of the address lines comprising transparent conductor material being improved by overlying metal layer regions, in the case where the silicon layer is self aligned to the gate conductor.

The invention is preferably used for making the active plate of an active matrix liquid crystal display. The invention also provides an active matrix liquid crystal display comprising this active plate, a passive plate, and a layer of liquid crystal material sandwiched between the active and passive plates.

Embodiments of the invention will now be described in detail, by way of example, with reference to the accompanying drawings, in which.

Figure 1:
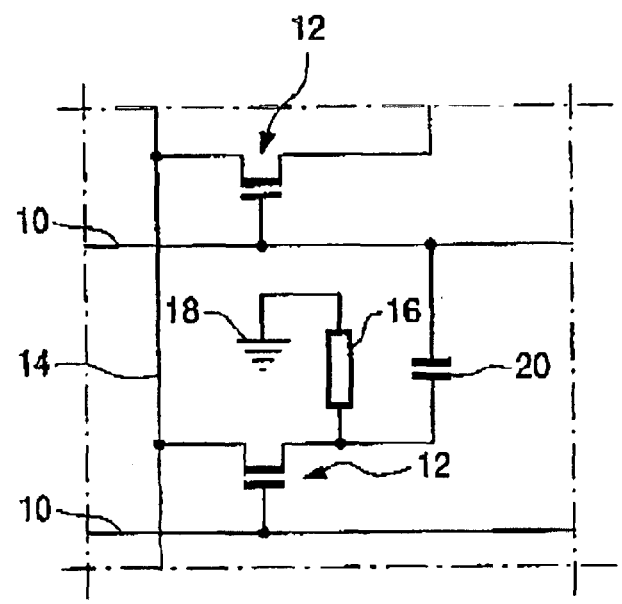
FIG. 1 shows the pixel components of an active plate.

It should be noted that the figures are diagrammatic and not drawn to scale. Relative dimensions and proportions of parts of these figures have been shown exaggerated or reduced in size, for the sake of clarity and convenience in the drawings. The same reference numbers are used throughout the Figures to denote the same, or similar, parts.

The application of the invention to a low mask count process for manufacturing the active plate of an active matrix liquid crystal display will now be described with reference to FIGS. 5A to 5M. The first steps of the process are common with known 2-mask processes.

Figure 5A:
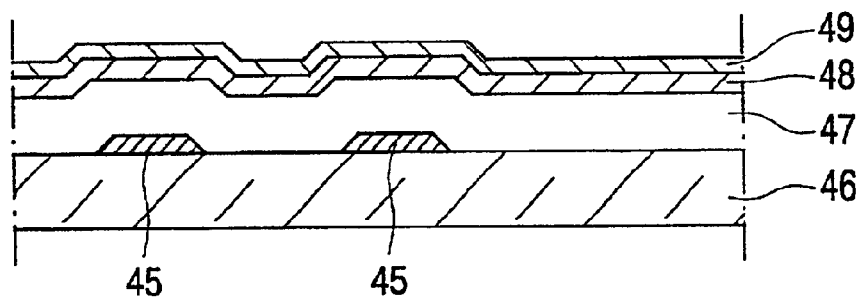
FIGS. 5A–5M illustrates various stages in a manufacturing method using the invention for manufacturing the active plate for an AMLCD display device.

FIG. 5A is a schematic diagram of the first stages of a low mask count process. The gate metal 45 (together with row address conductors which are not visible in this view) has been deposited and defined over an insulating substrate 46, for example of glass, and a standard Back Channel Etch TFT stack deposition carried out. This provides, in order from the substrate surface, a silicon nitride gate insulator layer 47, an amorphous silicon layer 48 and a doped amorphous silicon layer 49, which acts as a contact face. The area to the right of FIG. 5A will be used to form the switching transistors (12 of FIG. 1) associated with the pixels whereas the left part of FIG. 5A will form the row lead-in areas, where driving (gating) signals can be applied to the row conductors. Typically the SiN gate insulator 47 is 400 nm thick, the intrinsic amorphous silicon 48 is 160 nm thick and the doped amorphous silicon is 40 nm thick, although other thickness layers can be used. The doped silicon layer 49 may be microcrystalline silicon to give good quality ITO to silicon contracts.

Figure 5B:
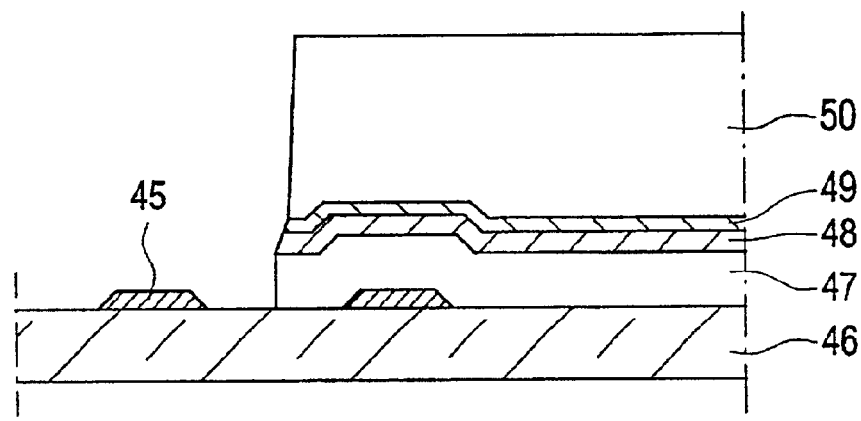
Figure 5C:
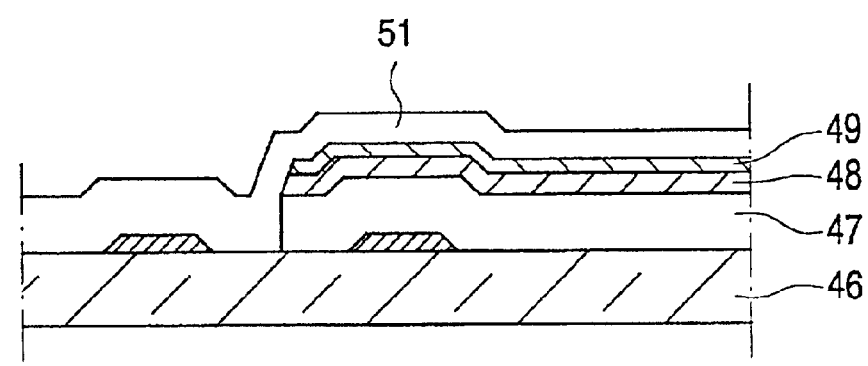

The TFT stack must be etched away from the row lead-in area. This only requires coarse alignment and no fine features to be etched. This masking step could be carried out by printing, laminating a plastic sheet on the array area before etching, or using coarsely aligned printed photoresist 50, as shown in FIG. 5B. In FIG. 5C, the TFT stack has been etched away from the row lead-in area, and a positive photoresist 51 is applied to the whole plate.

Figure 5D:
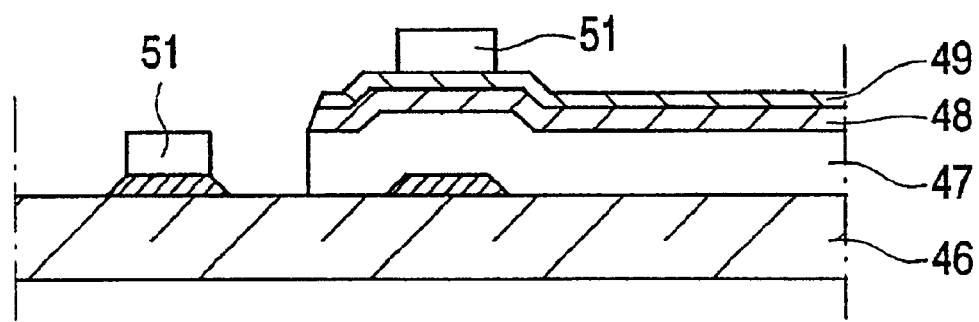

Rear illumination is then used to pattern the positive photoresist 51 to have the same configuration as the gate line 45, as shown in FIG. 5D. The remaining photoresist layer is used to pattern the two silicon layers 48 and 49 to leave the transistor channel area 52 in FIG. 5E. A transparent conducting layer 53, for example sputtered metal oxide layer, is then applied as a continuous layer over the whole plate, as shown in FIG. 5F.

Figure 3:
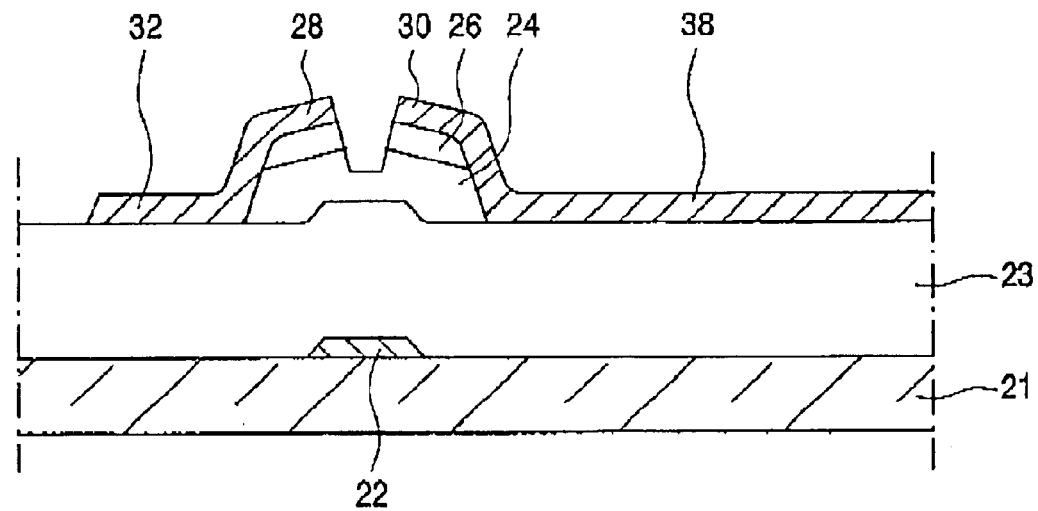
FIG. 3 shows a section through part of a proposed active plate using bottom gate TFTs and manufactured using a two mask process.

The steps in FIGS. 5A to 5F have previously been proposed. In this previous scheme, the fabrication process is continued by applying a photoresist layer completely over the structure on the substrate 46, patterning this photoresist layer using a mask, and using the patterned photoresist to define source and drain areas of the TFTs, column lines integral with the TFT source areas, and pixel electrodes so as to provide a structure similar to that of FIG. 3. In order to improve the conductivity of the transparent layer 53 at selected regions, particularly the column lines, the fabrication process following deposition of the transparent conducting layer 53 is modified, in accordance with the invention, as will now be described.

Figure 5E:
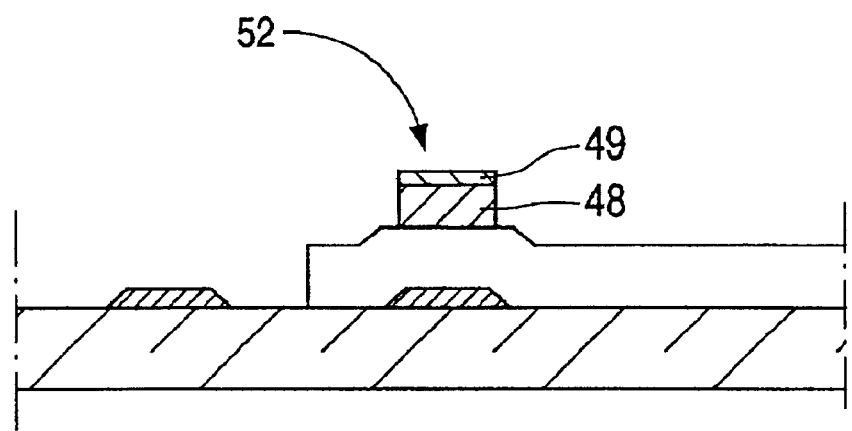
Figure 5F:
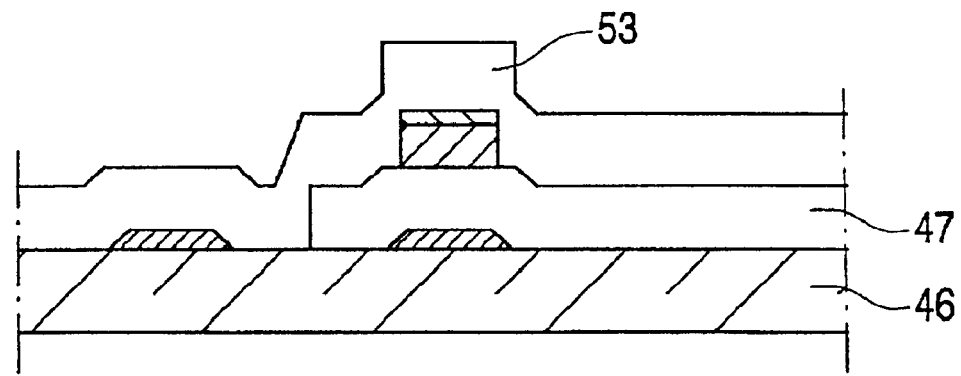
Figure 5G:
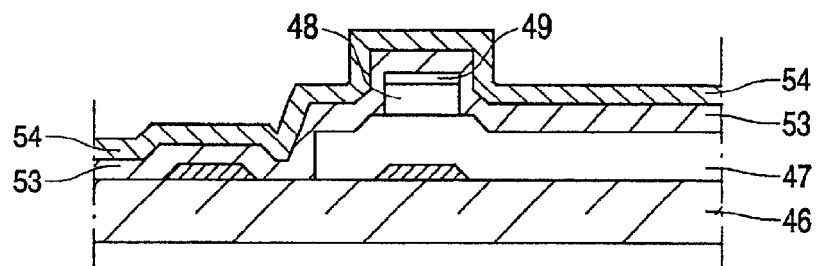

Following the provision of the transparent conducting layer 53, a layer 54 of metal is sputter deposited completely over the structure on the substrate 46 so as to cover the layer 53, as shown in FIG. 5G.

A layer of photoresist material is then applied over the metal layer 54 and patterned in a known, but unconventional, manner so as to leave photoresist in first and second selected areas with the thickness of the photoresist in the first and second areas being different. More specifically, the thickness of the photoresist left after patterning at areas corresponding to the regions where pixel electrodes are to be formed in less than the thickness at areas corresponding to the regions where column address lines are to be formed. This difference in thickness is achieved using a type of photolithographic patterning process of the kind described in the aforementioned paper by C. W. Han et al and as described by C. W. Kim et al in the paper entitled "A Novel Four Mask—Count Process Architecture for TFT-LCDs" published in SID 00 Digest at pages 1006 to 1009 whose contents are incorporated herein as reference material. The patterning technique described in these papers, which is directed specifically to defining TFT channels, uses so-called slit, or grey-tone, photolithography. This entails exposing the photoresist through a photolithographic mask which consists of solid (opaque) areas, transparent areas, and areas with grid or slit patterns. The solid areas block exposure light and thus serve to define regions of the photoresist layer intended to be left at full thickness while the transparent areas serve to define regions which are to be removed upon developing the layer. The areas comprising a pattern of slits are used to define partially exposed photoresist regions resulting in reduced thickness regions. The parameters of the slit patterns required for this objective are described in the aforementioned papers, to which reference is invited for further information in this respect. This partial exposure, which relies on diffraction effects obtained from the slits, means that the regions of the photoresist concerned remain after development of the photoresist but at a reduced thickness compared with the (full) thickness found at regions protected by the solid, light-blocking, areas of the mask. Essentially, therefore, the approach proposed in these papers enables the photoresist layer to be patterned into regions having two different, and controlled, thicknesses, as well as providing regions where the resist is totally removed.

This effect is utilised in the method according to the present invention to enable selective patterning of the transparent conducting layer 53 and the overlying metal layer 54.

Figure 5H:
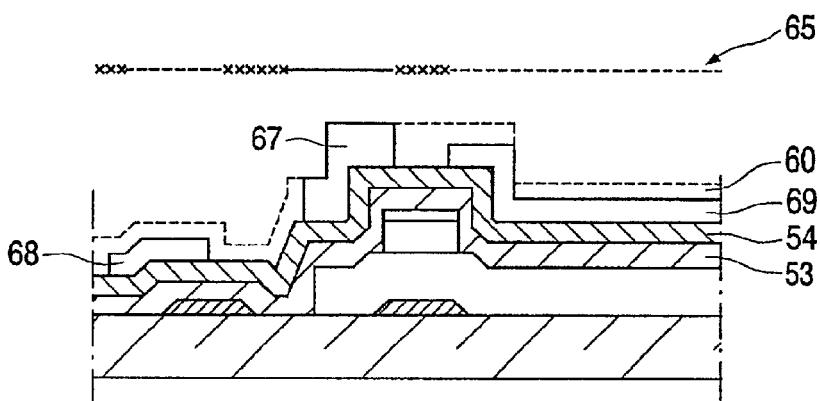

Referring to FIG. 5H, then the structure shown in FIG. 5G is covered by a layer of photoresist 60, in this case positive photoresist, indicated in dotted outline and patterned using the aforementioned kind of mask, depicted here schematically at 65, and comprising light blocking portions, transparent portions, and slit pattern portions denoted by a solid line, crosses, and dashes respectively. The patterning of the photoresist layer 60 using this mask results in regions of the layer exposed to light through the transparent portions of the mask being completely removed, regions of the layer shielded from exposure light by the light blocking areas of the mask remaining at substantially full thickness, and regions of the layer partially exposed through the areas of the mask with slit patterns to be left but with considerably reduced thickness. Thus, as is shown in FIG. 5H, a region 67 of full thickness photoresist is defined over an area corresponding to the region where the TFT source contact and associated column line are to be formed, a region 68 of reduced thickness photoresist is defined at an area overlying the gate metal 45 in the row lead-in area, and a region 69 of similarly reduced thickness photoresist is defined over an area corresponding to the region where the TFT drain contact and pixel electrode are to be formed.

Figure 5I:
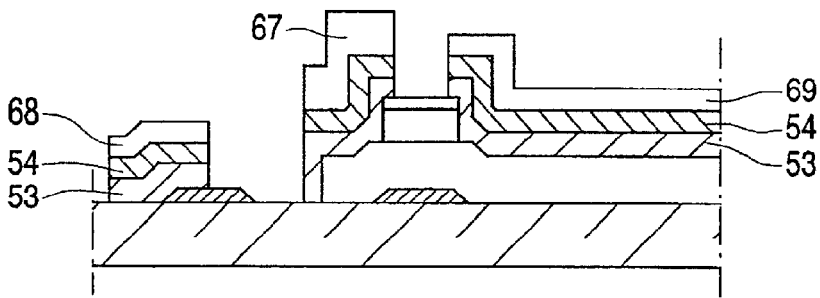

Exposed areas of the metal layer 54 and the immediately underlying areas of the transparent conducting layer 53 are then etched away to leave the structure shown in FIG. 5I, the remaining regions of photoresist serving to shield the corresponding underlying regions of the metal and transparent conductive layers during this process.

Figure 5J:
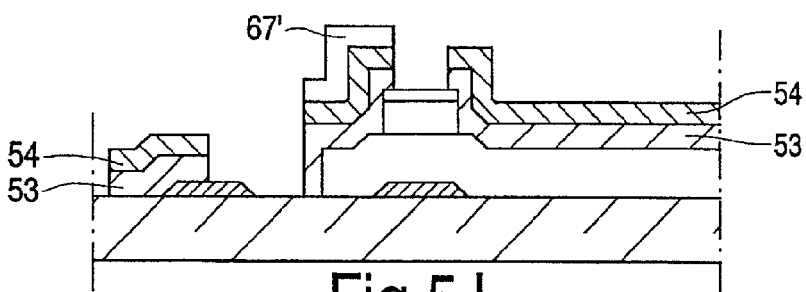

A controlled, partial, etch of the photoresist is then performed so as to remove a predetermined thickness of the photoresist layer corresponding to the thickness of the areas 68 and 69, thereby completely removing these areas while still leaving photoresist material, 67', at the full-thickness areas 67 but consequentially with reduced thickness. The result of such etching of the photoresist layer is illustrated in FIG. 5J. The etching is preferably carried out in a plasma etcher using mainly oxygen as the process gas.

Figure 5K:
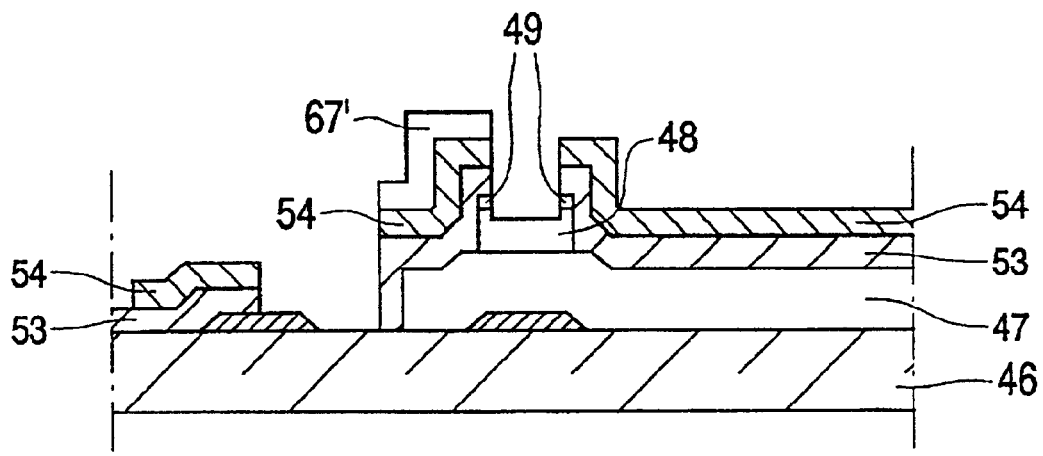

Thereafter, a controlled plasma etch is carried out to completely remove a portion of the doped silicon layer 49 overlying the eventual channel region of the TFT and intermediate the end parts of this layer region covered by the layers 53, 54 and 67', as shown in FIG. 5K.

Figure 5L:
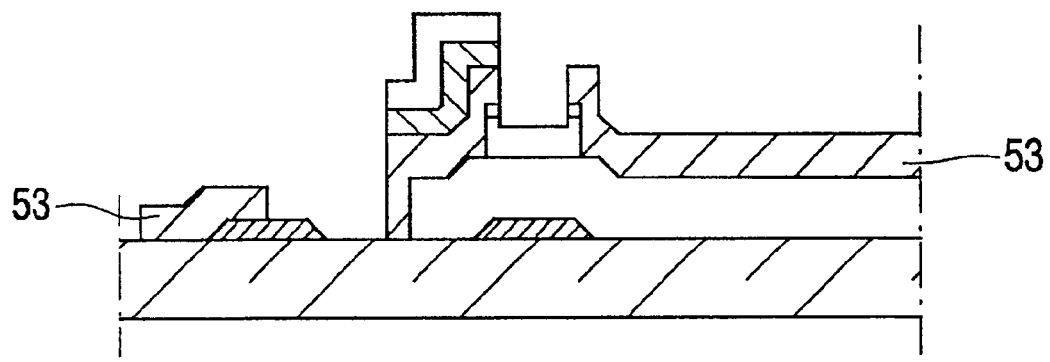
Figure 5M:
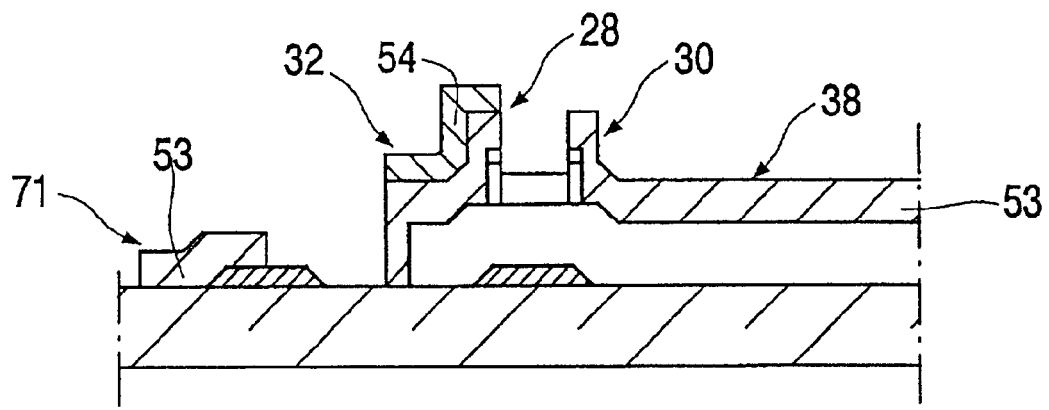

Exposed regions of the metal layer 54 are then etched away, FIG. 5L, using a selective etchant and finally the remaining portions 67' of photoresist are removed to leave the structure shown in FIG. 5M. In this structure, it is not essential that the remaining portions of the photoresist be removed and they could be left for simplicity of desired. As will be apparent, therefore, the completed structure comprises a TFT device and associated pixel electrode 38, in which the pixel electrode comprises patterned transparent conducting material and has an integral extension forming the TFT drain contact 30. Patterned transparent conducting material also provides the TFT source contact 28 formed integrally with a column line 32 with these parts having a composite structure and further including a correspondingly—shaped, and directly overlying, layer of metal for improving particularly the conductivity of the column line. A portion of transparent conducting material 71 is also provided extending over the metal layer 45 at the row lead-in region, which is preferably for TAB bonding purposes.

Figure 6:
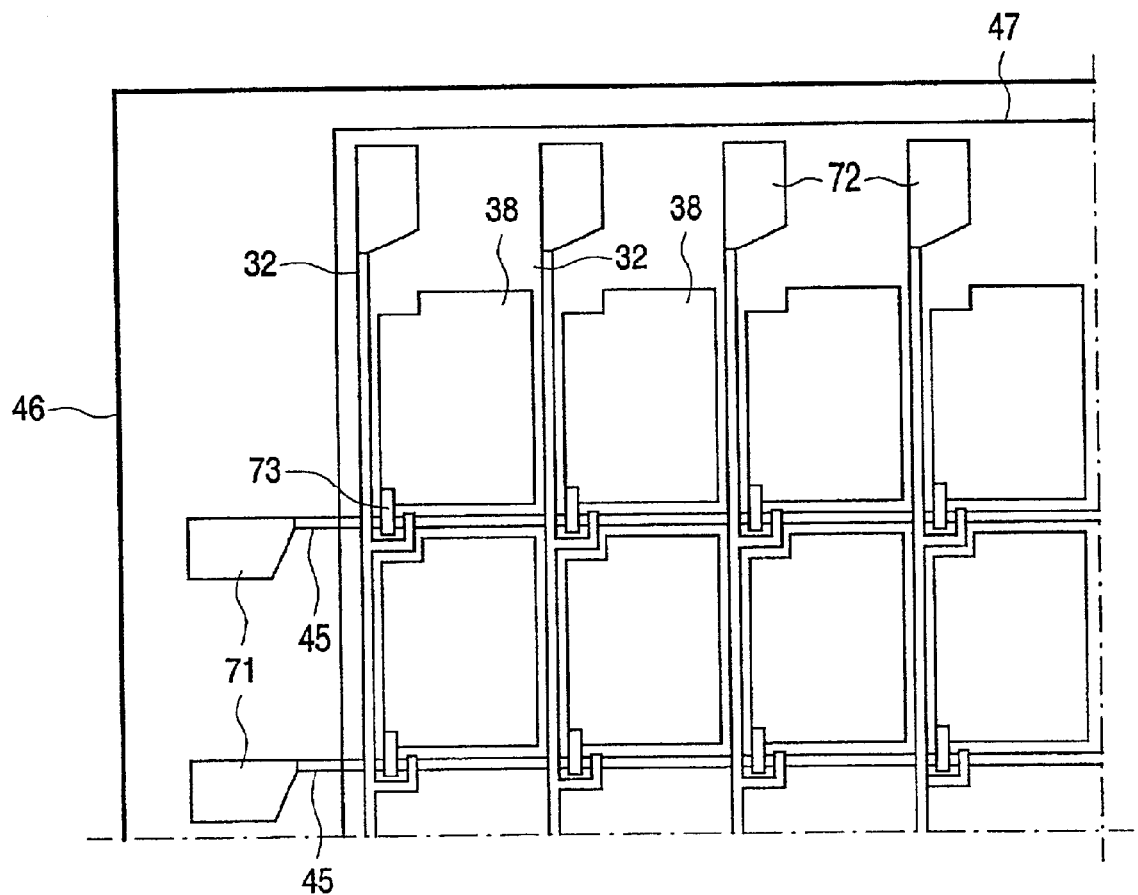
FIG. 6 is a plan view of part of the active plate formed using the method of FIG. 5.

FIG. 6 shows schematically in plan view a part of the so-formed active plate comprising a row and column array of such TFTs and pixel electrodes, the part being adjacent one corner of the array. Here, the regions 71 of transparent conducting material forming contact pads for the row (gating) conductors of the array can be seen, as can similarly formed contact pads 72 of the transparent conducting material of the column lines 32.

Although in the above described embodiment the metal layer 54 is patterned so as to leave only transparent conducting material to form the TFT drain contacts, an overlying metal layer portion could be provided at the drain contact region in similar manner to that used for providing metal at the source contact region, using an appropriate light blocking area in the photoresist exposure mask to define this area. The presence of metal for this purpose is shown at 73 in FIG. 6. The provision of metal of both the source and drain contacts may be preferable for obtaining better defined edges to the source and drain contacts.

In conventional AMLCDs, ITO (Indium Tin Oxide) is commonly used as the material for transparent conducting layers. However, when such material is in contact with metals having a high value of electronegativity, such as aluminium, then unwanted etching due to electrochemistry may occur. For this reason IZO (indium Zinc Oxide) is now starting to be used and such material is preferable for the transparent conducting layer 53. The conductive metal used for the layer 54 could be Al, Mo, Ag, Cu, or an alloy incorporating one or more of these metals. It could also be a multi-layer in which a contact layer comprising, for example, Cr or W lies underneath a main conductor of a metal as listed above.

It will be appreciated that the order of the processing sequence in the above—described embodiment can be changed while still producing the same general result. For example, back exposure using the gate electrode as a mask to define the TFT silicon layers is not essential and a conventional photolithographic patterning operation may be used instead to define the amorphous silicon islands, although then, of course, the overall number of mask steps used would increase from two to three.

With the method described previously employing back exposure using the row (gate line) metal as a mask in the definition of the amorphous silicon island for the TFT then a problem could arise due to a parasitic TFT being created along this row conductor between adjacent column lines. This is likely to be a problem particularly for active plates with a large diagonal, such as those used in AMLCDs for TV application, and for high resolution displays. This problem can be avoided by providing the transparent conducting layer 53 such that it is discontinuous over a region of the row line between subsequently formed adjacent column lines rather than being provided as a continuous layer completely over the substrate, at least in the area of the pixel array.

Figure 7:
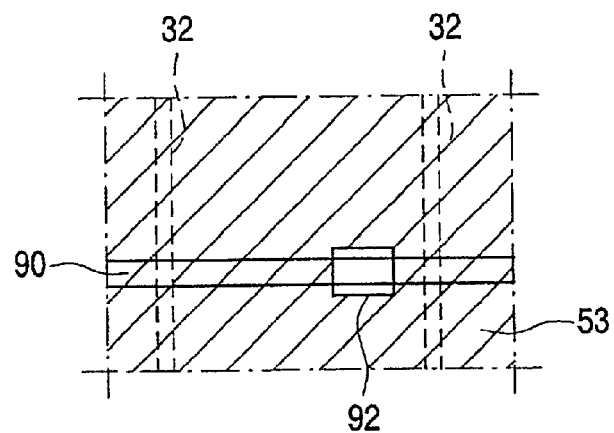
FIG. 7 shows a modification which can be employed at one stage in the manufacturing method according to the invention.

One possibility in this respect is illustrated schematically in FIG. 7 which shows in plan view a part of the active plate at a stage generally corresponding to that of FIG. 5E in which a gate (row) line, here referenced 90, is present on the substrate together with the overlying silicon layers 48 and 49. FIG. 7 also shows, in dotted outline, the position of two, adjacent column lines 32 which are formed at a later stage. In this case, the transparent conducting layer 53, indicated by hatching, is deposited over the substrate as a generally continuous layer but with a hole, or opening, as illustrated at 92, overlying the gate line 90 at an area between the two adjacent column lines 32, and away from the region at which the TFT is formed. The region of the amorphous silicon layers 48 and 49 then left exposed through this hole can be removed by etching from over the gate line at the position of this hole, thereby preventing the formation of a parasitic TFT in this region. In order to provide the layer 53 having such holes, a printing technique is preferably employed rather than the layer 53 being sputter deposited. Printing the layer readily enables coarse areas over the gate lines to be left open.

The use of a patterned photoresist layer comprising regions of different thicknesses to enable selective patterning of the deposited transparent conducting layer, 53, and metal layer, 54, as described above is particularly convenient. The technique employed is compatible with existing thin film processes and production equipment used in the fabrication of active plates.

It is envisaged, however, that the required selective patterning of the transparent conducting layer and overlying metal layer could be accomplished using a suitable shielding layer, for example again a resist material, whose properties, particularly with regard to its etching rate characteristics, can be modified locally in some way other than by producing different thicknesses so as to achieve similar results. Referring again to FIG. 5H, then if, for example, the deposited photoresist layer 60 were instead of a material which could be treated such that the region overlying the eventual pixel electrode and TFT drain contact was rendered less etch resistant than the region overlying the eventual column line and TFT source contact then, when subjected to the subsequent etching process, the former region could be removed whilst leaving a shielding layer at the latter region, thereby producing a structure generally as in FIG. 5J. It is also envisaged that a shielding layer of an appropriate, etchable, material other than photoresist and which is similarly capable of being patterned into regions of different thicknesses could be used instead for the layer 50.

Figure 4:
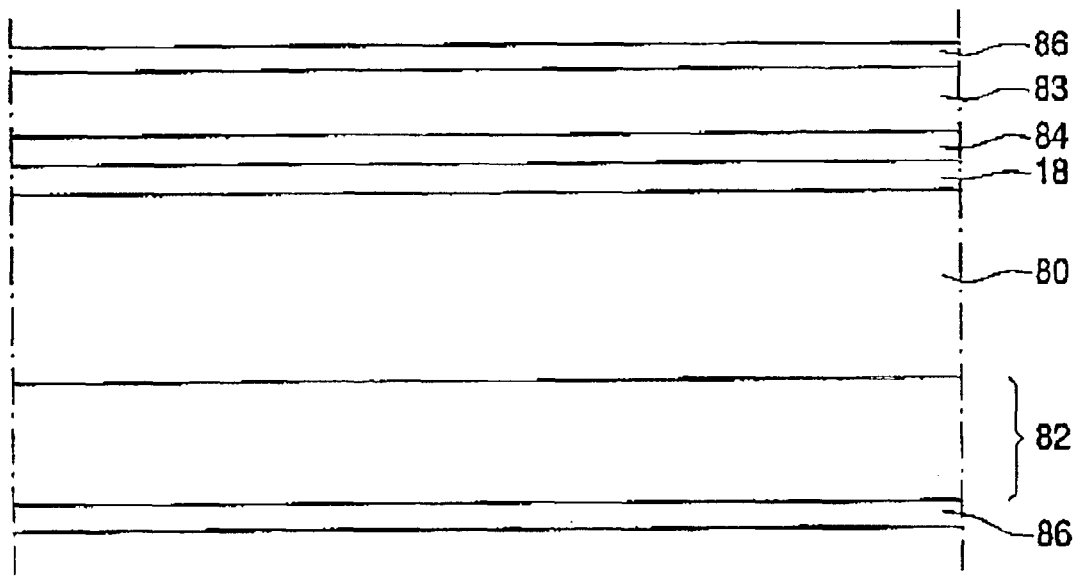
FIG. 4 shows schematically the structure of a complete liquid crystal display.
Figure 2:
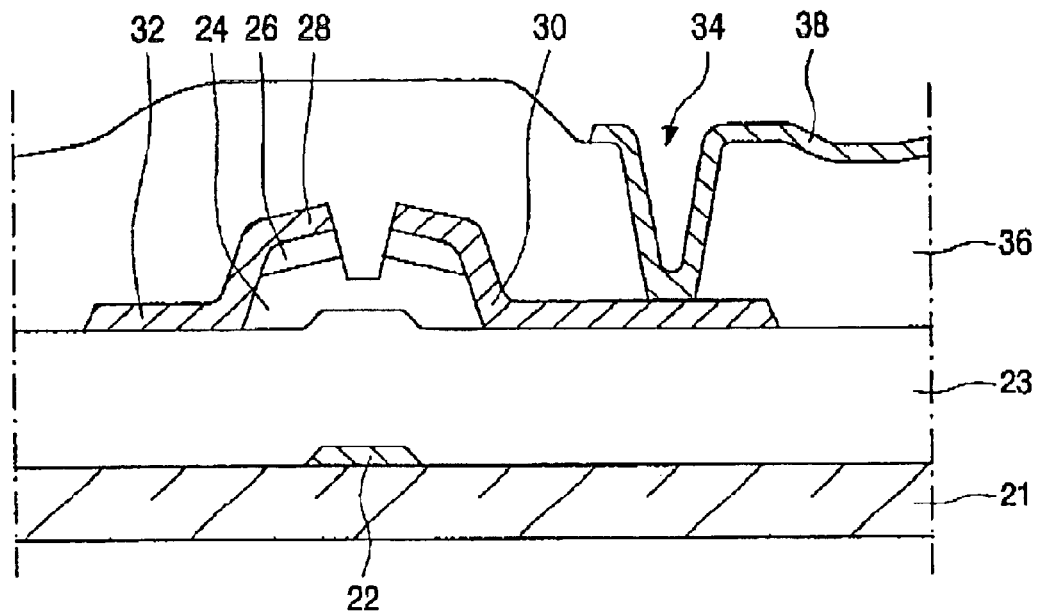
FIG. 2 shows a section through part of a conventional active plate using bottom gate TFTs and manufactured using a five mask process.

FIG. 4 shows the structure of a complete liquid crystal display which incorporates the active plate, here referenced generally at 82. A layer of liquid crystal material 80 is provided over the active plate 82, which comprises the structure described above. A further substrate 83 overlies the layer of liquid crystal material. This further substrate 83 may be provided on one face with an arrangement of colour filters 84 and a layer defining the common electrode 18 (shown in FIG. 1). Polarizing films 86 are also provided on opposite sides of the substrate 82 and 83.

As this invention is concerned specifically with the active, transistor, substrate, the operation and construction of the liquid crystal display will not be described in any further detail as this will be apparent to those skilled in the art.

Additional layers to those described may be provided, and there are various alternatives which will be apparent to those skilled in the art. The specific processing parameters and materials have not been described in detail in this application, as this invention relies upon known individual processing steps and materials. The steps, and the range of possible alternatives, will be apparent to those skilled in the art.

The specific example above uses amorphous silicon TFTs in the active plate of the LCD, but other semiconductor arrangements are possible, such as polycrystalline or microcrystalline.

In the specific example described, bottom gate transistors are used, but top gate transistors may also be used.

The invention has been described in detail when applied to an active matrix LCD. The invention can also be applied to active matrix LED displays and to image sensors. The invention may be applied to any pixellated device requiring transparent pixel electrodes, where there may be benefit in defining the pixel electrodes using the same layer as for row or column lines of the device. The invention can also be applied to transmissive and reflective active matrix LCD displays. In the case of reflective displays, it may still be desirable to use a transparent layer as ITO has well known benefits for forming the source and drain contacts.

In the examples described above, a transmissive display is shown, and the pixel electrode is transparent and therefore shielded from the plating operation. For a reflective display, the pixel electrode may be plated together with the column conductors, so that only the source and drain areas are shielded.

From reading the present disclosure, other modifications will be apparent to persons skilled in the art. Such modifications may involve other features which are already known in the field of AMLCDs and the like and which may be used instead of or in addition to features already described herein.

What is claimed is:

1. A method of fabricating an active plate comprising pixel electrodes and associated address lines formed from a transparent conductive material, comprising:

providing a transparent conductive material layer and a metal layer in succession over a substrate;

depositing and patterning a shielding layer into a configuration corresponding to the desired pattern of the transparent conductive layer required for the pixel electrodes and the address lines, the shielding layer being formed in a manner such that an etching property of the shielding layer at regions corresponding to the pixel electrodes differs from that at the regions corresponding to the address lines;

subjecting the shielding layer to an etching process using the difference in properties so as to remove the regions of the shielding layer corresponding to the pixel electrodes while leaving portions of the shielding layer at the regions corresponding to the address lines; and thereafter removing the portions of the metal layer at the regions corresponding to the pixel electrodes.

2. The method of claim 1, wherein the property of the shielding layer which differs comprises the thickness of the layer, in that the regions of the shielding layer corresponding to the pixel electrodes comprise thinner regions, and in that the step of etching the shielding layers comprises a partial etch to remove the thinner shielding layer regions.

3. The method of claim 2, wherein the shielding layer comprises photoresist.

4. The method of claim 3, wherein the shielding layer is patterned using a photomask comprising areas which result in partial exposure of the photoresist material at the regions corresponding to the pixel electrodes to produce areas of reduced thickness at these regions.

5. The method of claim 1 wherein the transparent conductive material comprises a transparent metal oxide.

6. The method of claim 1, wherein thin film transistors (TFTs) are formed on the substrate in association with the pixel electrodes and address lines, and in that portions of the transparent conductive layer are used to provide source and drain contacts for the TFTs which portions are defined by regions of the patterned shielding layer.

7. The method of claim 1 for forming the active plate of an active matrix liquid crystal display device.

8. A method of manufacturing an active plate for a liquid crystal display, comprising:

depositing and pattering a gate conductor layer over an insulating substrate;

depositing a gate insulator layer over the patterned gate conductor layer;

depositing a silicon layer over the gate insulator layer;

depositing a transparent conductor layer over the substrate;

depositing a metal layer over the transparent conductor layer;

depositing and patterning an etchable shielding layer over the metal layer, the shielding layer having a configuration defining source and drain areas, pixel electrode areas, and line conductor areas associated with the source or drain conductors, the regions of the shielding layer defining the line conductor areas having a thickness greater than that of the regions defining the pixel electrodes;

patterning the transparent conductor layer and the metal layer using the shielding layer;

partially etching the shielding layer to remove the thinner regions so as to expose the metal layer at the pixel electrode regions; and removing the metal layer regions at the pixel electrode regions.

9. The method of claim 8, wherein the silicon layer is patterned prior to the deposition of the transparent conductor layer by a self-aligned process using the gate conductor layer.

10. The method of claim 8, wherein the shielding layer comprises photoresist.

* * * * *